United States Patent
Park

(10) Patent No.: US 7,106,634 B2
(45) Date of Patent: Sep. 12, 2006

(54) SEMICONDUCTOR MEMORY DEVICE AND METHOD OF INPUTTING OR OUTPUTTING DATA IN THE SEMICONDUCTOR MEMORY DEVICE

(75) Inventor: Duk-Ha Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/009,167

(22) Filed: Dec. 10, 2004

(65) Prior Publication Data

US 2005/0128817 A1   Jun. 16, 2005

(30) Foreign Application Priority Data

Dec. 11, 2003   (KR) ...................... 10-2003-0090081

(51) Int. Cl.
*G11C 7/00*   (2006.01)
(52) U.S. Cl. ............................ 365/189.05; 365/189.08; 365/191
(58) Field of Classification Search ........... 365/189.05, 365/191, 189.07
See application file for complete search history.

(56) References Cited

U.S. PATENT DOCUMENTS

| | | | |
|---|---|---|---|
| 5,686,844 A | 11/1997 | Hull et al. | |
| 5,867,446 A * | 2/1999 | Konishi et al. | ............. 365/233 |
| 6,057,705 A | 5/2000 | Wojewoda et al. | |
| 6,188,638 B1 | 2/2001 | Kuhne | |
| 6,807,108 B1 * | 10/2004 | Maruyama et al. | .... 365/189.05 |
| 2002/0034119 A1 | 3/2002 | Lee et al. | |

FOREIGN PATENT DOCUMENTS

KR   1998-016286   5/1998

OTHER PUBLICATIONS

English language abstract of Korean publication No. 1998-016286.

* cited by examiner

*Primary Examiner*—Son T. Dinh
(74) *Attorney, Agent, or Firm*—Marger Johnson & McCollom, P.C.

(57) ABSTRACT

A semiconductor memory device selects data strobe types according to an operating mode. The buffer selection circuit selects one of a first operating mode and a second operating mode, and generates an output buffer control signal and an input buffer control signal. The output buffer reads first data stored in the memory cell array, and outputs the first data to the input/output pad under the control of the output buffer control signal. The input buffer receives second data from the input/output pad, and writes the second data to the memory cell array under the control of the input buffer control signal. Accordingly, the semiconductor memory device is capable of transmitting data both in the bilateral strobe type and in the unilateral strobe type.

20 Claims, 3 Drawing Sheets

SEMICONDUCTOR MEMORY DEVICE AND METHOD OF INPUTTING OR OUTPUTTING DATA IN THE SEMICONDUCTOR MEMORY DEVICE

CLAIM FOR PRIORITY

This application relies for priority upon Korean Patent Application No. 2003-0090081 filed on Dec. 11, 2003, the contents of which are herein incorporated by reference in their entirety.

BACKGROUND OF THE INVENTION

1. Field of the Invention

The invention relates to a semiconductor memory device, and particularly to a semiconductor memory device capable of selecting data strobe types according to an operating mode.

2. Description of the Related Art

A semiconductor memory device needs to be used for various operating modes that have different strobe types. Conventionally, circuit designers design a semiconductor memory device differently according to a data strobe type. Because a semiconductor memory device with the same function is designed differently according to the data strobe type, the cost of designing the semiconductor memory device is high.

FIG. 1 is a schematic diagram showing the data transmission of a bilateral strobe type between a memory device and a memory controller, and FIG. 2 is a schematic diagram showing the data transmission of a unilateral strobe type between the memory device and the memory controller.

Referring to FIG. 1, a memory device 10 includes an upper memory 11 and a lower memory 13. The upper memory 11 transmits data to a memory controller 20 and receives data from the memory controller 20 through the channel UDQS of a bilateral strobe type. The lower memory 13 transmits data to the memory controller 20 and receives data from the memory controller 20 through the channel LDQS of the bilateral strobe type.

Referring to FIG. 2, the upper memory 11 and the lower memory 13 receive data from the memory controller 20 through an input channel DS, and the upper memory 11 and the lower memory 13 transmit data to the memory controller 20 through an output channel QS.

A semiconductor memory device uses bit organizations. For example, a bit organization of a semiconductor memory device of 16 Mbit×8 is referred to as a bit organization of X8, and a bit organization of a semiconductor memory device of 4 Mbit×16 is referred to as a bit organization of X16. The bit organization X8 represents that 8 bits of data may be input and/or output simultaneously using 8 pins.

In the semiconductor memory devices that are used today, the semiconductor memory device using a bit organization of X8 and the semiconductor memory device using a bit organization of X16 are a bilateral strobe type. In other words, the semiconductor memory devices using the organizations of X8 or X16 have a pin structure DQS through which the data may be inputted and outputted. The semiconductor memory device using a bit organization of X9, the semiconductor memory device using a bit organization of X18, and the semiconductor memory device using a bit organization of X36 are a unilateral strobe type. In other words, the semiconductor memory devices using the organizations of X9, X18, or X36 have a pin structure DS through which the data may be only inputted or have a pin structure QS through which the data may be only outputted.

Accordingly, there is a need for a semiconductor memory device capable of transmitting both the bilateral strobe type data and the unilateral strobe type data.

SUMMARY OF THE INVENTION

It is a first feature of the invention to provide a semiconductor memory device capable of selectively transmitting bilateral strobe type data and unilateral strobe type data according to an operating mode.

It is a second feature of the invention to provide a semiconductor memory device capable of selectively transmitting bilateral strobe type data and unilateral strobe type data according to a bit organization.

It is a third feature of the invention to provide a method of inputting or outputting data using a semiconductor memory device capable of selectively transmitting bilateral strobe type data and unilateral strobe type data according to an operating mode.

In some exemplary embodiments of the invention, there is provided a semiconductor memory device including a memory cell array, an input/output pad, a buffer selection circuit, an output buffer, and an input buffer.

The buffer selection circuit receives a read signal, a write signal, and an internal information, selects one of a first operating mode and a second operating mode, and generates an output buffer control signal and an input buffer control signal whose state are determined by the selected operating mode.

The output buffer reads first data stored in the memory cell array, and outputs the first data to the input/output pad in response to the output buffer control signal.

The input buffer receives second data from the input/output pad, and writes the second data to the memory cell array in response to the input buffer control signal.

The buffer selection circuit includes a mode selection circuit, an inverter, a first OR gate, a second OR gate, a first AND gate, and a second AND gate.

The mode selection circuit selects one of the first operating mode and the second operating mode in response to the internal information, and generates a first mode control signal and a second mode control signal. The inverter inverts the second mode control signal. The first OR gate executes an OR operation on the first mode control signal and an output signal of the inverter. The second OR gate executes an OR operation on the first mode control signal and the second mode control signal. The first AND gate executes an AND operation on the read signal and an output signal of the first OR gate. The second AND gate executes an AND operation on the write signal and an output signal of the second OR gate.

When the semiconductor memory device operates in the first operating mode, the output buffer or the input buffer may be selected in response to the read signal and the write signal, and the first data may be output from the memory cell array, or the second data may be received from the input/output pad to be stored in the memory cell array. Further, when the semiconductor memory device operates in the second operating mode, the input buffer may be selected in response to the read signal and the write signal, and the second data may be received from the input/output pad to be stored in the memory cell array.

In other exemplary embodiments of the invention, there is provided a semiconductor memory device including a memory cell array, an input/output pad, a buffer selection circuit, an output buffer, and an input buffer.

The buffer selection circuit includes a mode selection circuit, an inverter, a first OR gate, a second OR gate, a first AND gate, and a second AND gate.

The mode selection circuit selects one of the first operating mode and the second operating mode in response to the internal information, and generates a first mode control signal and a second mode control signal. The inverter inverts the second mode control signal. The first OR gate executes an OR operation on the first mode control signal and the second mode control signal. The second OR gate executes an OR operation on the first mode control signal and an output signal of the inverter. The first AND gate executes an AND operation on the read signal and an output signal of the first OR gate. The second AND gate executes an AND operation on the write signal and an output signal of the second OR gate.

When the semiconductor memory device operates in the first operating mode, the output buffer or the input buffer may be selected in response to the read signal and the write signal, and first data may be output from the memory cell array, or second data may be received from the input/output pad to be stored in the memory cell array. Further, when the semiconductor memory device operates in the second operating mode, the output buffer may be selected in response to the read signal and the write signal, and the first data are output to the input/output pad from the memory cell array.

The internal information may be a mode register set (MRS) signal generated in the semiconductor memory device.

The first operating mode and the second operating mode may be bit organizations of a different.

In other exemplary embodiments of the invention, a method of inputting and outputting data in a semiconductor memory device includes receiving a read signal, a write signal, and an internal information to select one of a first operating mode and a second operating mode in response to the internal information; generating an output buffer control signal and an input buffer control signal whose state are determined by the selected operating mode; reading first data stored in the memory cell array to output the first data to the input/output pad in response to the output buffer control signal; and receiving second data from the input/output pad to write the second data to the memory cell array in response to the input buffer control signal.

The semiconductor memory device according to the invention is capable of transmitting both the bilateral strobe type data and the unilateral strobe type data selectively. Accordingly, the semiconductor memory device according to the invention can reduce the cost of chip design because the transmission of more than two strobe types of data is possible.

BRIEF DESCRIPTION OF THE DRAWINGS

The above and other features and advantages of the invention will become more apparent by describing in detail exemplary embodiments with reference to the accompanying drawings.

DESCRIPTION OF EMBODIMENTS

Detailed illustrative embodiments of the invention are disclosed herein. However, specific structural and functional details disclosed herein are merely representative for purposes of describing exemplary embodiments of the invention.

Figure 1:
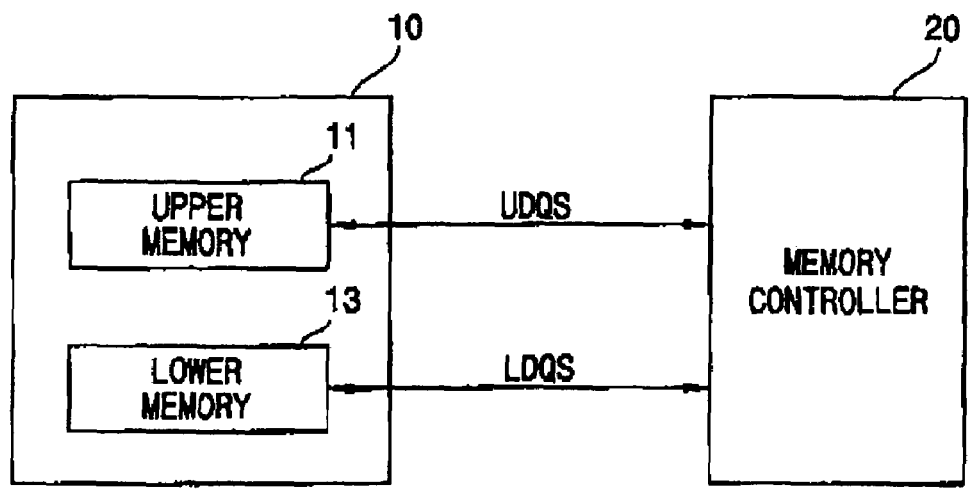
FIG. 1 is a schematic diagram showing the data transmission of a bilateral strobe type between a memory device and a memory controller, according to a conventional art.
Figure 2:
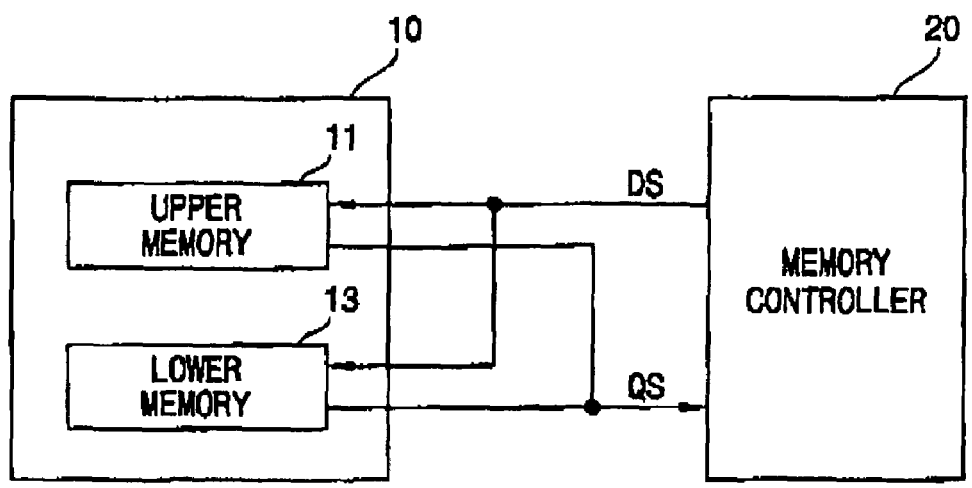
FIG. 2 is a schematic diagram showing the data transmission of a unilateral strobe type between a memory device and a memory controller, according to a conventional art.
Figure 3:
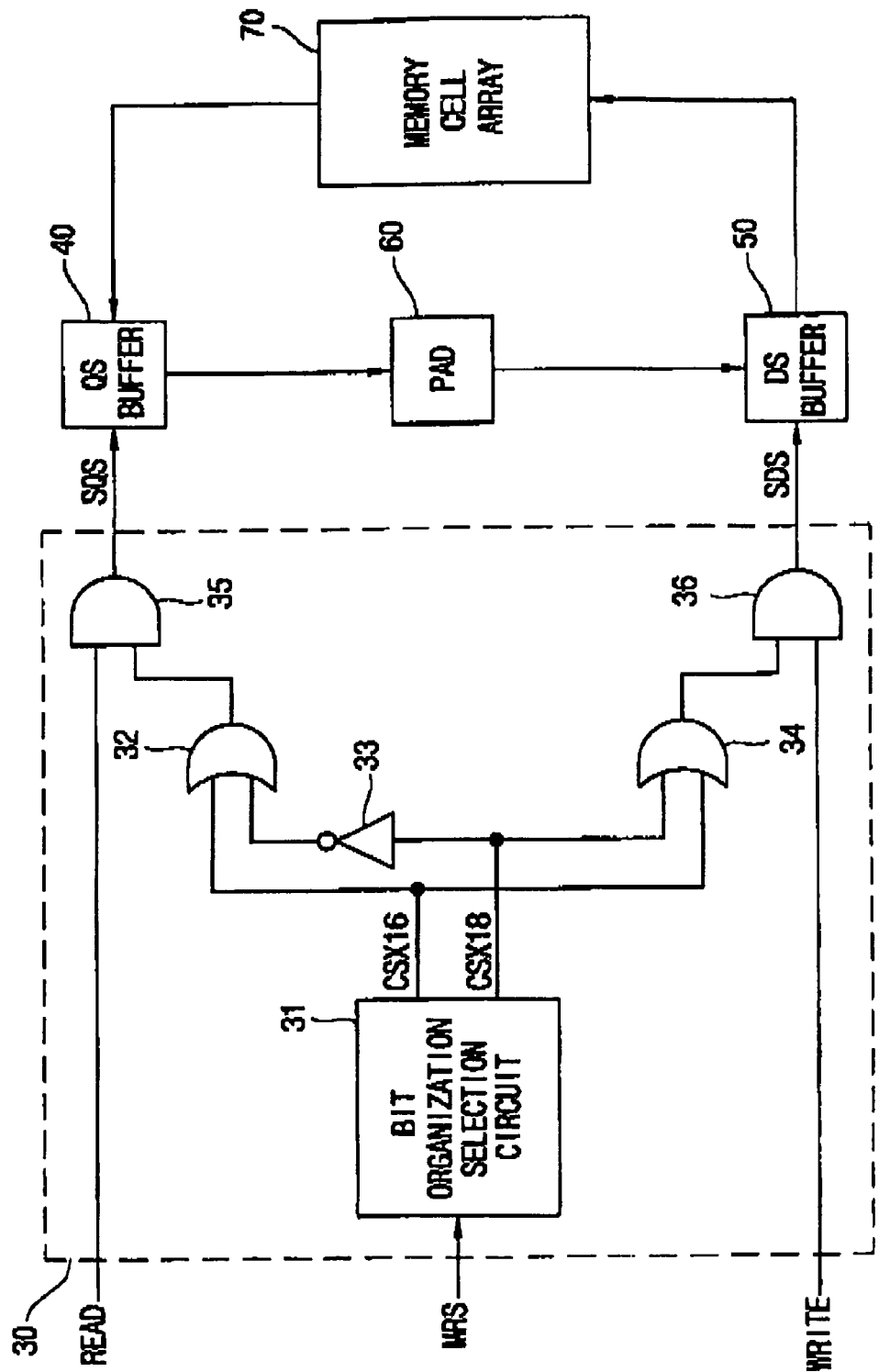
FIG. 3 is a circuit diagram of a semiconductor memory device capable of transmitting data both in a bilateral strobe type and in a unilateral strobe type according to a first exemplary embodiment of the invention.

FIG. 3 is a circuit diagram of a semiconductor memory device capable of transmitting data both in a bilateral strobe type and in a unilateral strobe type according to a first exemplary embodiment of the invention. The semiconductor memory device of FIG. 3 can determine the bilateral strobe type or the unilateral strobe type by selecting one of an X16 bit organization and an X18 bit organization.

Referring to FIG. 3, the semiconductor memory device includes a memory cell array 70, an input/output pad 60, a buffer selection circuit 30, an output buffer (QS buffer) 40, and an input buffer (DS buffer) 50.

Data are stored in the memory cell array 70. The input/output pad 60 receives the data stored in the memory cell array 70 through the output buffer 40 and transmits the read data to an external pin (not shown). Moreover the input/output pad 60 receives data from the external pin and stores the received data, via the input buffer 50, in the memory cell array 70.

The buffer selection circuit 30 receives a read signal READ, a write signal WRITE, and a mode register set (MRS) signal. The buffer selection circuit 30 also generates an output buffer control signal SQS and an input buffer control signal SDS whose states are determined by the bit organization selected in response to the MRS signal.

The output buffer 40 reads data stored in the memory cell array 70, and buffers to transmit the read data to the input/output pad 60 in response to the output buffer control signal SQS.

The input buffer 50 receives data from the input/output pad 60, and buffers to write the received data to the memory cell array 70 in response to the input buffer control signal SDS.

The buffer selection circuit 30 includes a bit organization selection circuit 31, an inverter 33, a first OR gate 32, a second OR gate 34, a first AND gate 35, and a second AND gate 36.

The bit organization selection circuit 31 selects one of the X16 bit organization and the X18 bit organization, and generates an X16 control signal CSX16 and an X18 control signal CSX18. The inverter 33 inverts the X18 control signal CSX18. The OR gate 32 receives the X16 control signal CSX16 and the output signal of the inverter 33, and executes an OR operation. Also, the OR gate 34 receives the X16 control signal CSX16 and the X18 control signal CSX18, and executes an OR operation. The AND gate 35 receives the read signal READ and the output signal of the OR gate 32, executes an AND operation, and outputs the output buffer control signal SQS. Also, the AND gate 36 receives the write signal WRITE and the output signal of the OR gate 34, executes an AND operation, and outputs the input buffer control signal SDS.

Referring back to FIG. 3, the operation of the semiconductor memory device according to the first exemplary embodiment of the invention will be described.

First, the operation of the semiconductor memory device of FIG. 3 using an X16 bit organization is as follows.

In response to the MRS signal bearing information for using the X16 bit organization, the X16 control signal CSX16 turns to a "high" state and the X18 control signal CSX18 turns to a "low" state. The output of the inverter 33 turns to a "high" state. The output of the OR gate 32 turns to a "high" state, and the output buffer control signal SQS, which is the output of the AND gate 35, turns to a "high" state when the read signal READ is a "high" state according to the occurrence of read command. Accordingly, the output buffer 40 is enabled and data stored in the memory cell array 70 is output. These data are to be buffered in the output buffer 40 and transmitted to the external pin (not drawn) through the input/output pad 60.

Continuing with this example of the semiconductor memory device using the X16 bit organization, the output of the OR gate 34 is a "high" state. At this time, when the write command is activated and the write signal WRITE becomes a "high" state, the input buffer control signal SDS, i.e., the output of the AND gate 36, has a "high" state. Accordingly, the input buffer 50 is enabled and data are received from the external pin through the input/output pad 60. The received data are buffered in the input buffer 50 and are stored in the memory cell array 70.

As mentioned above, when the semiconductor memory device of FIG. 3 is using the X16 bit organization, the input or output operation will be done through the external pin according to the state of the read signal READ or the write signal WRITE. In other words, the semiconductor memory device of FIG. 3 operates as a bilateral strobe type when the semiconductor memory device is using the X16 bit organization.

Next, the operation of the semiconductor memory device of FIG. 3 when the semiconductor memory device is using the X18 bit organization is as follows.

In response to the MRS signal having information for using the X18 bit organization, the X18 control signal CSX18 becomes a "high" state and the X16 control signal CSX16 becomes a "low" state. The output of the inverter 33 becomes a "low" state. The output of the OR gate 32 becomes a "low" state, and the output buffer control signal SQS becomes a "low" state regardless of the state of the read signal READ. Accordingly, the output buffer 40 is disabled and the output operation of data will not be performed.

Continuing with this example of the semiconductor memory device using the X18 bit organization, the output of the OR gate 34 is a "high" state. At this time, when the write command is activated and the write signal WRITE becomes a "high" state, the input buffer control signal SDS, i.e. the output of the AND gate 36, becomes a "high" state. Accordingly, the input buffer 50 is enabled and data are received from the external pin through the input/output pad 60. The received data are buffered in the input buffer 50 and stored in the memory cell array 70.

As mentioned above, when the semiconductor memory device of FIG. 3 is using the X18 bit organization, the input operation will be done through the external pin according to the state of the write signal WRITE, and the output operation will not be done. In other words, the semiconductor memory device of FIG. 3 operates as a unilateral strobe type in which only the input operation of data is possible when the semiconductor memory device is using the X18 bit organization.

Figure 4:
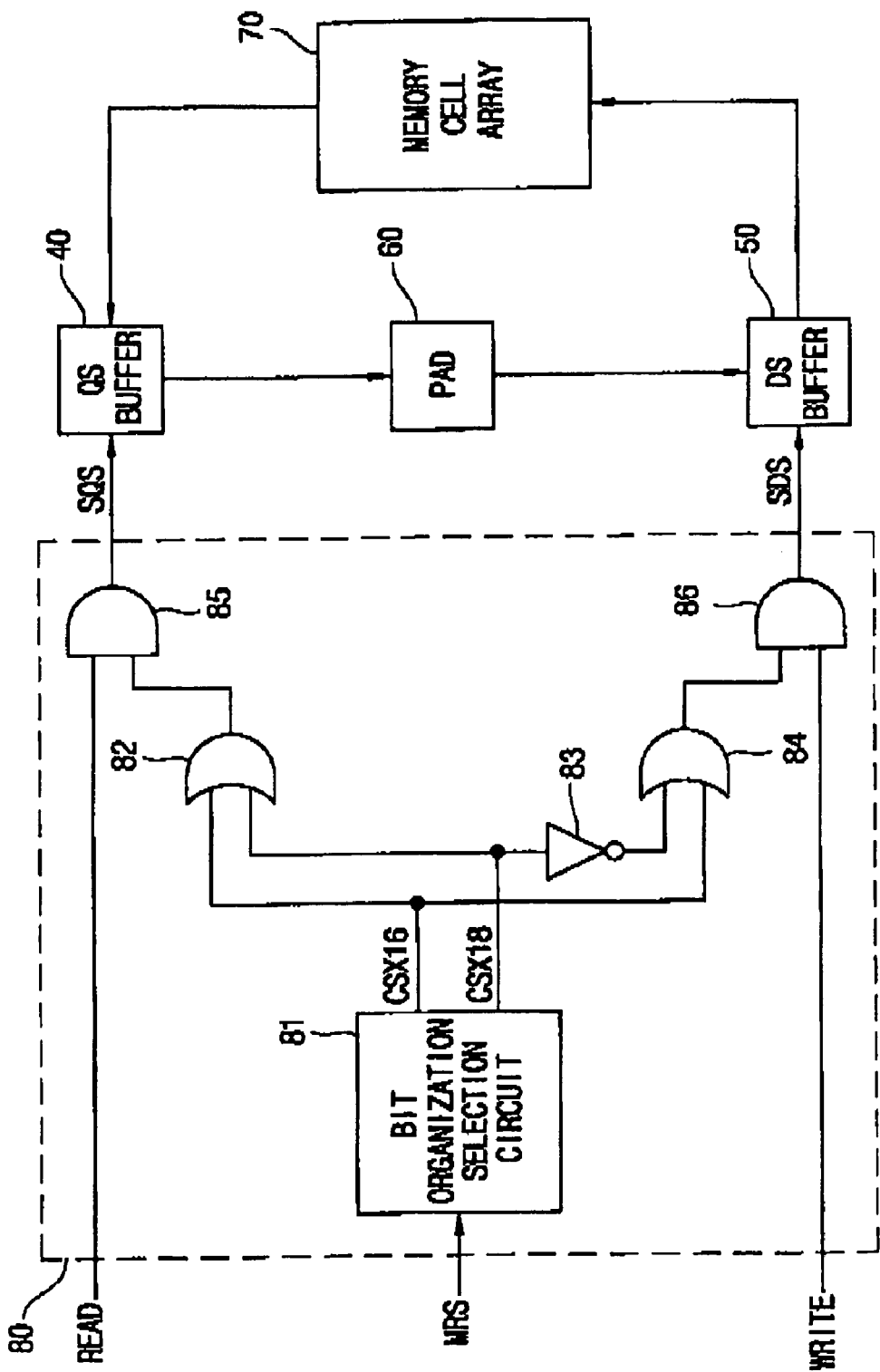
FIG. 4 is a circuit diagram of a semiconductor memory device capable of transmitting data both in a bilateral strobe type and in a unilateral strobe type according to a second exemplary embodiment of the invention.

FIG. 4 is a circuit diagram of a semiconductor memory device capable of transmitting data both in a bilateral strobe type and in a unilateral strobe type according to a second exemplary embodiment of the invention. The circuit of FIG. 4 is different from the circuit of FIG. 3 in that the buffer selection circuit of FIG. 4 is different from that of FIG. 3. Further, in the circuit of FIG. 4, only the output (or read) operation is possible in case the X18 bit organization is used, unlike in the circuit of FIG. 3.

Referring to FIG. 4, the semiconductor memory device includes a memory cell array 70, an input/output pad 60, a buffer selection circuit 80, an output buffer 40, and an input buffer 50.

The buffer selection circuit 80 receives a read signal READ, a write signal WRITE, and a mode register set (MRS) signal. The buffer selection circuit 80 also generates an output buffer control signal SQS and an input buffer control signal SDS whose states are determined by the bit organization selected in response to the MRS signal.

The buffer selection circuit 80 includes a bit organization selection circuit 81, an inverter 83, a first OR gate 82, a second OR gate 84, a first AND gate 85, and a second AND gate 86.

The bit organization selection circuit 81 selects one of the X16 bit organization and the X18 bit organization, and generates an X16 control signal CSX16 and an X18 control signal CSX18. The inverter 83 inverts the X18 control signal CSX18. The OR gate 82 receives the X16 control signal CSX16 and the X18 control signal CSX18, and executes an OR operation. Also, the OR gate 84 receives the X16 control signal CSX16 and the output signal of the inverter 83, and executes an OR operation. The AND gate 85 receives the read signal READ and the output signal of the OR gate 82, executes an AND operation, and outputs the output buffer control signal SQS. Also, the AND gate 86 receives the write signal WRITE and the output signal of the OR gate 84, executes an AND operation, and outputs the input buffer control signal SDS.

Referring back to FIG. 4, the operation of the semiconductor memory device according to the second exemplary embodiment of the invention will be described. First, the operation of the semiconductor memory device of FIG. 4 using an X16 bit organization is as follows.

In response to the MRS signal bearing information for using the X16 bit organization, the X16 control signal CSX16 turns to a "high" state and the X18 control signal CSX18 turns to a "low" state. The output of the inverter 83 turns to a "high" state. The output of the OR gate 82 turns to a "high" state, and the output buffer control signal SQS, which is the output of the AND gate 85, turns to a "high" state when the read signal READ is a "high" state according to the occurrence of a read command. Accordingly, the output buffer 40 is enabled and data stored in the memory cell array 70 is output. These data are to be buffered in the output buffer 40 and transmitted to the external pin (not drawn) through the input/output pad 60.

Continuing with this example of the semiconductor memory device using the X16 bit organization, the output of the OR gate 84 is a "high" state. At this time, when the write command is activated and the write signal WRITE becomes a "high" state, the input buffer control signal SDS, i.e., the output of the AND gate 86, has a "high" state. Accordingly, the input buffer 50 is enabled and data are received from the external pin through the input/output pad 60. The received data are buffered in the input buffer 50 and are stored in the memory cell array 70.

As mentioned above, when the semiconductor memory device of FIG. 4 is using the X16 bit organization, the input or output operation will be done through the external pin according to the state of the read signal READ or the write signal WRITE. In other words, the semiconductor memory device of FIG. 4 operates as a bilateral strobe type when the semiconductor memory device is using the X16 bit organization.

Next, the operation of the semiconductor memory device of FIG. 3 when the semiconductor memory device is used as a X18 bit organization is as follows.

In response to the MRS signal having information for using the X18 bit organization, the X18 control signal CSX18 becomes a "high" state and the X16 control signal CSX16 becomes a "low" state. The output of the inverter 83 becomes a "low" state. The output of the OR gate 82 becomes a "high" state, and the output buffer control signal SQS, which is the output of the AND gate 85, becomes a "high" state when the read signal READ is a "high" state according to the activation of a read command. Accordingly, the output buffer 40 is enabled and data stored in the memory cell array 70 is output. These data are to be buffered in the output buffer 40 and transmitted to the external pin (not shown) through the input/output pad 60.

Continuing with this example of the semiconductor memory device is using the X18 bit organization, the output of the OR gate 84 is a "low" state, and the input buffer control signal SDS becomes a "low" state regardless of the state of the write signal WRITE. Accordingly, the input buffer 50 is disabled and the input operation of data will not be performed.

As mentioned above, when the semiconductor memory device of FIG. 4 is using the X18 bit organization, the output (or read) operation will be performed through the external pin according to the state of the read signal READ and the input (or write) operation will not be done. In other words, the semiconductor memory device of FIG. 4 operates as a unilateral strobe type in which only the output operation is possible when the semiconductor memory device is using the X18 bit organization.

In the embodiments of FIG. 3 and FIG. 4, the semiconductor memory device can select one of the X16 bit organization and the X18 bit organization and perform the input and/or output operation according to the MRS signal. However, any signal other than the MRS signal having information about a bit organization may be used to select the bit organization.

In the embodiments of FIG. 3 and FIG. 4, the semiconductor memory device can select the X16 bit organization and the X18 bit organization. However, the semiconductor memory device according to above exemplary embodiments of the invention may be adapted to a semiconductor memory device using various bit organizations. Further, the semiconductor memory device according to above exemplary embodiments of the invention may be adapted to the semiconductor memory device using various operating modes to select one of the various operating modes.

While the exemplary embodiments of the invention and its advantages have been described in detail, it should be understood that various changes, substitutions and alterations can be made herein without departing from the scope of the invention as defined by appended claims.

What is claimed is:

1. A semiconductor memory device, comprising:
   a memory cell array;
   a pad;
   a buffer selection circuit to receive a read signal, a write signal, and an internal information, to select one of a first operating mode and a second operating mode in response to the internal information, and to generate an output buffer control signal and an input buffer control signal whose states are determined by the selected operating mode;
   an output buffer to read first data stored in the memory cell array to output the first data to the pad in response to the output buffer control signal; and
   an input buffer to receive second data from the pad to write the second data to the memory cell array in response to the input buffer control signal.

2. The semiconductor memory device of claim 1, wherein the internal information is a mode register set signal that is generated in the semiconductor memory device.

3. The semiconductor memory device of claim 1, wherein the buffer selection circuit comprises:
   a mode selection circuit to select one of the first operating mode and the second operating mode to generate a first mode control signal and a second mode control signal;
   an inverter to invert the second mode control signal;
   a first OR gate to execute a first OR operation on the first mode control signal and an output signal of the inverter;
   a second OR gate to execute a second OR operation on the first mode control signal and the second mode control signal;
   a first AND gate to execute a first AND operation on the read signal and an output signal of the first OR gate; and
   a second AND gate to execute a second AND operation on the write signal and an output signal of the second OR gate.

4. The semiconductor memory device of claim 3, wherein when the semiconductor memory device operates in the first operating mode, one of the output buffer and the input buffer is selected in response to the read signal and the write signal, and the first data are output from the memory cell array or the second data are received from the pad to be stored in the memory cell array.

5. The semiconductor memory device of claim 3, wherein when the semiconductor memory device operates in the second operating mode, the input buffer is selected in response to the read signal and the write signal, and the second data are received from the pad and are stored in the memory cell array.

6. The semiconductor memory device of claim 1, wherein the buffer selection circuit comprises:
   a mode selection circuit to select one of the first operating mode and the second operating mode in response to the internal information, and to generate a first mode control signal and a second mode control signal;
   an inverter to invert the second mode control signal;
   a first OR gate to execute a first OR operation on the first mode control signal and the second mode control signal;
   a second OR gate to execute a second OR operation on the first mode control signal and an output signal of the inverter;
   a first AND gate to execute a first AND operation on the read signal and an output signal of the first OR gate; and
   a second AND gate to execute a second AND operation on the write signal and an output signal of the second OR gate.

7. The semiconductor memory device of claim 1, wherein when the semiconductor memory device operates in the first operating mode, the output buffer or the input buffer is selected in response to the read signal and the write signal, and the first data are output from the memory cell array or the second data are received from the pad and are stored in the memory cell array.

8. The semiconductor memory device of claim 1, wherein when the semiconductor memory device operates in the second operating mode, the output buffer is selected in response to the read signal and the write signal, and the first data are output to the pad from the memory cell array.

9. A semiconductor memory device, comprising:
   a memory cell array;
   a pad;
   a buffer selection circuit to receive a read signal, a write signal, and an internal information, to select one of a first bit organization and a second bit organization in response to the internal information, and to generate an output buffer control signal and an input buffer control signal whose states are determined by the selected bit organization;
   an output buffer to read first data stored in the memory cell array to output the first data to the pad in response to the output buffer control signal; and
   an input buffer to receive second data from the pad to write the second data to the memory cell array in response to the input buffer control signal.

10. The semiconductor memory device of claim 9, wherein the internal information is a mode register set signal that is generated in the semiconductor memory device.

11. The semiconductor memory device of claim 9, wherein the buffer selection circuit comprises:
   a bit organization selection circuit to select one of the first bit organization and the second bit organization in response to the internal information, and to generate a first bit control signal and a second bit control signal;
   an inverter to invert the second bit control signal;
   a first OR gate to execute a first OR operation on the first bit control signal and an output signal of the inverter;
   a second OR gate to execute a second OR operation on the first bit control signal and the second bit control signal;
   a first AND gate to execute a first AND operation on the read signal and an output signal of the first OR gate; and
   a second AND gate to execute a second AND operation on the write signal and an output signal of the second OR gate.

12. The semiconductor memory device of claim 11, wherein when the semiconductor memory device operates with the first bit organization, one of the output buffer and the input buffer is selected in response to the read signal and the write signal, and the first data are output from the memory cell array or the second data are received from the pad to be stored in the memory cell array.

13. The semiconductor memory device of claim 11, wherein when the semiconductor memory device operates with the second bit organization, the input buffer is selected in response to the read signal and the write signal, and the second data are received from the pad and are stored in the memory cell array.

14. The semiconductor memory device of claim 9, wherein the first bit organization is an X8 type bit organization or an X16 type bit organization, and the second bit organization is an X9 type bit organization, an X18 type bit organization or an X36 type bit organization.

15. The semiconductor memory device of claim 9, wherein the buffer selection circuit comprises:
   a bit organization selection circuit to select one of the first bit organization and the second bit organization, and to generate a first bit control signal and a second bit control signal;
   an inverter to invert the second bit control signal;
   a first OR gate to execute a first OR operation on the first bit control signal and the second bit control signal;
   a second OR gate to execute a second OR operation on the first bit control signal and an output signal of the inverter;
   a first AND gate to execute a first AND operation on the read signal and an output signal of the first OR gate; and
   a second AND gate to execute a second AND operation on the write signal and an output signal of the second OR gate.

16. The semiconductor memory device of claim 9, wherein when the semiconductor memory device operates with the first bit organization, the output buffer or the input buffer is selected in response to the read signal and the write signal, and data are output from the memory cell array or data are received from the pad and are stored in the memory cell array.

17. The semiconductor memory device of claim 9, wherein when the semiconductor memory device operates with the second bit organization, the output buffer is selected in response to the read signal and the write signal, and the first data are output to the pad from the memory cell array.

18. A method of inputting or outputting data in a semiconductor memory device, comprising:
   receiving a read signal, a write signal, and an internal information to select one of a first operating mode and a second operating mode in response to the internal information;
   generating an output buffer control signal and an input buffer control signal whose state are determined by the selected operating mode;
   reading first data stored in the memory cell array to output the first data to a pad in response to the output buffer control signal; and
   receiving second data from the pad to write the second data to the memory cell array in response to the input buffer control signal.

19. A method of inputting or outputting data in a semiconductor memory device, comprising:
   receiving a read signal, a write signal, and an internal information to select one of a first bit organization and a second bit organization in response to the internal information;
   generating an output buffer control signal and an input buffer control signal whose state are determined by the selected bit organization;
   reading first data stored in the memory cell array to output the first data to a pad in response to the output buffer control signal; and
   receiving second data from the pad to write the second data to the memory cell array in response to the input buffer control signal.

20. The method of claim 19, wherein the first bit organization is an X8 type bit organization or an X16 type bit organization, and the second bit organization is an X9 type bit organization, an X18 type bit organization or an X36 type bit organization.

* * * * *